United States Patent
Kim et al.

(10) Patent No.: US 10,741,596 B2
(45) Date of Patent: Aug. 11, 2020

(54) IMAGE SENSING DEVICE AND METHOD FOR FORMING THE SAME

(71) Applicant: SK hynix Inc., Icheon-si (KR)

(72) Inventors: Chul Kim, Cheongju-si (KR); Young Woong Do, Icheon-si (KR); Won Jin Kim, Cheongju-si (KR); Jong Hwan Kim, Suwon-si (KR); Sung Jun Park, Cheongju-si (KR); Moung Seok Baek, Cheongju-si (KR); Ju Sang Lee, Cheongju-si (KR); Seong Hoe Jeong, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/515,601

(22) Filed: Jul. 18, 2019

(65) Prior Publication Data

US 2020/0212095 A1    Jul. 2, 2020

(30) Foreign Application Priority Data

Dec. 28, 2018   (KR) .......................... 10-2018-0172824

(51) Int. Cl.
  *H01L 27/146*   (2006.01)

(52) U.S. Cl.
  CPC .. *H01L 27/14623* (2013.01); *H01L 27/14621* (2013.01); *H01L 27/14685* (2013.01); *H01L 27/14689* (2013.01)

(58) Field of Classification Search
  CPC ......... H01L 27/14623; H01L 27/14685; H01L 27/14689; H01L 27/14621
  See application file for complete search history.

(56) References Cited

U.S. PATENT DOCUMENTS

| | | | |
|---|---|---|---|
| 9,728,570 B2 * | 8/2017 | Chiang | H01L 27/1463 |
| 2013/0285181 A1 * | 10/2013 | Lin | H01L 27/1463 257/432 |
| 2015/0263054 A1 * | 9/2015 | Chien | H01L 27/14623 257/292 |
| 2016/0172398 A1 * | 6/2016 | Kim | H01L 27/14621 257/432 |
| 2017/0133414 A1 * | 5/2017 | Chiang | H01L 27/1463 |
| 2017/0373116 A1 * | 12/2017 | Lin | H01L 27/14609 |
| 2019/0157329 A1 * | 5/2019 | Kim | H01L 27/14621 |
| 2020/0013809 A1 * | 1/2020 | Lee | H01L 27/1464 |

FOREIGN PATENT DOCUMENTS

| | | |
|---|---|---|
| KR | 10-2015-0044646 | 4/2015 |
| KR | 10-2016-0072513 | 6/2016 |

* cited by examiner

*Primary Examiner* — Victor A Mandala
(74) *Attorney, Agent, or Firm* — Perkins Coie LLP

(57) ABSTRACT

An image sensing device and a method for forming the same are disclosed. The image sensing device includes a substrate including one or more photoelectric conversion elements, and a grid structure disposed over the substrate. The grid structure includes an air layer, a support film formed over the air layer, and a capping film formed at side surfaces of the air layer and the support film and at a top surface of the support film.

20 Claims, 19 Drawing Sheets

IMAGE SENSING DEVICE AND METHOD FOR FORMING THE SAME

CROSS-REFERENCE TO RELATED APPLICATION

This patent document claims priority to and benefits of Korean patent application No. 10-2018-0172824, filed on Dec. 28, 2018, which is incorporated herein by reference in its entirety.

TECHNICAL FIELD

The technology and implementations disclosed in this patent document relate to an image sensing device.

BACKGROUND

An image sensor is a device that is used to convert an optical image into an electrical signal. With the recent development of computer industries and communication industries, demand for high-quality and high-performance image sensors is driven by various electronics applications such as digital cameras, camcorders, personal communication systems (PCSs), game consoles, surveillance cameras, medical micro-cameras, robots, etc.

SUMMARY

This patent document provides, among others, designs of an image sensing device that can effectively prevent optical crosstalk between the color filters.

Some embodiments of the disclosed technology relate to an image sensing device that includes an air grid structure to effectively prevent optical crosstalk between the color filters while minimizing loss of light.

In an embodiment of the disclosed technology, an image sensing device may include a substrate including an array of photoelectric conversion elements, and a grid structure disposed over the substrate to divide space above the substrate into different sensing regions with each sensing region including one or more photoelectric conversion elements. The grid structure may include an air layer, a support film formed over the air layer, and a capping film formed at side surfaces of the air layer and the support film and at a top surface of the support film.

In another embodiment of the present disclosure, a method for forming an image sensing device includes forming a sacrificial film over a substrate including one or more photoelectric conversion elements, forming a support material layer over the sacrificial film, patterning the sacrificial film and the support material layer, and forming a stacked structure of a sacrificial film pattern and a support film in a predefined grid structure region, forming a first capping film to cover the stacked structure of the sacrificial film pattern and the support film, removing the sacrificial film pattern, and forming an air layer at a position from which the sacrificial film pattern is removed, and forming a second capping film over the first capping film.

In another embodiment of the present disclosure, an image sensing device may include a substrate including at least one photoelectric conversion element, and a grid structure disposed over the substrate. The grid structure may include an air layer, a support film formed over the air layer, and a capping film formed not only at side surfaces of the air layer and the support film, but also at a top surface of the support film.

In another embodiment of the present disclosure, a method for forming an image sensing device includes forming a sacrificial film over a substrate including at least one photoelectric conversion element, forming a support material layer over the sacrificial film, patterning the sacrificial film and the support material layer, and forming a stacked structure of a sacrificial film pattern and a support film in a predefined grid structure region, forming a first capping film to cover the stacked structure of the sacrificial film pattern and the support film, removing the sacrificial film pattern, and forming an air layer at a position from which the sacrificial film pattern is removed, and forming a second capping film over the first capping film.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the present disclosure will become readily apparent with reference to the following detailed description when considered in conjunction with the accompanying drawings.

DETAILED DESCRIPTION

Figure 1:
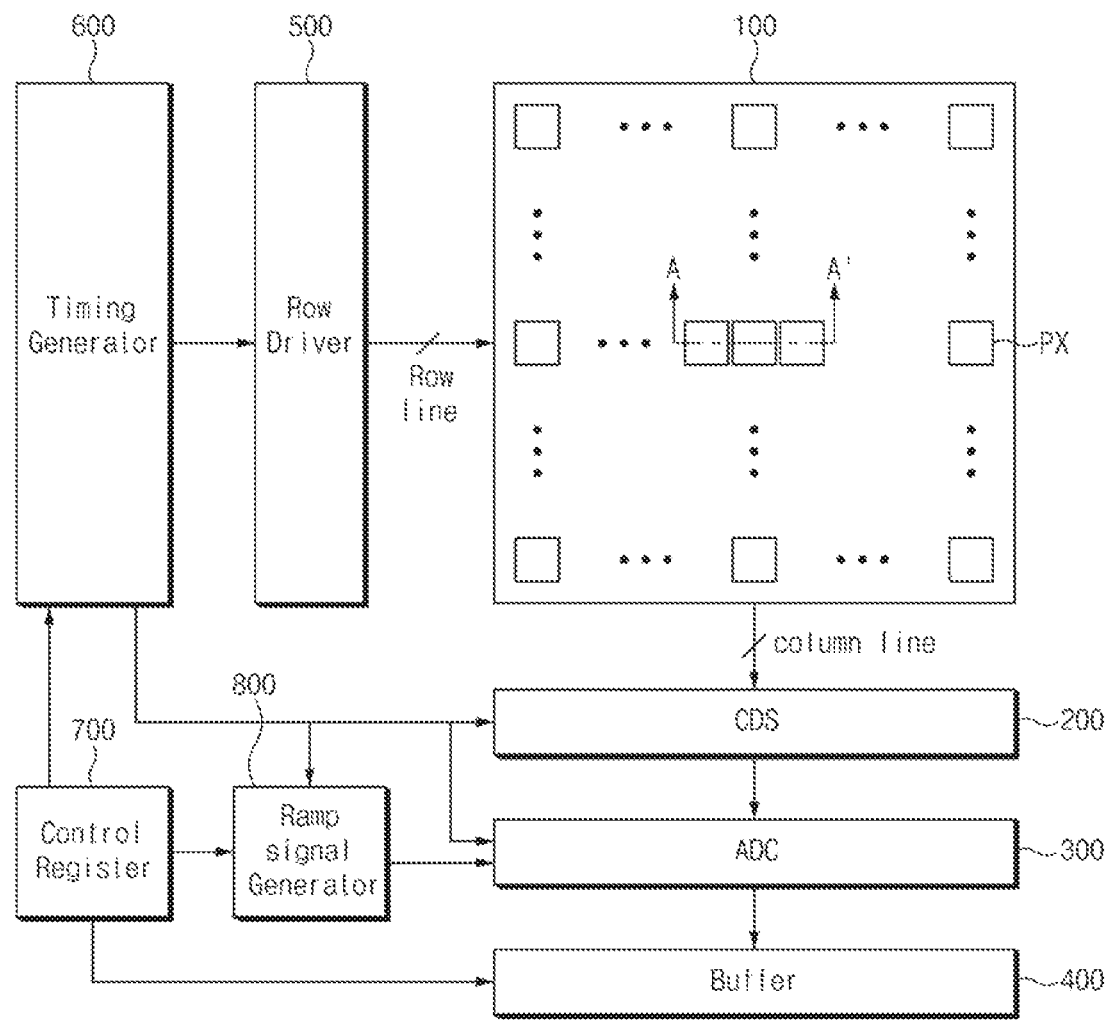
FIG. 1 is a block diagram illustrating an image sensing device based on an embodiment of the disclosed technology.

FIG. 1 is a block diagram illustrating an image sensing device based on an embodiment of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixels (PXs) arranged in a matrix shape. The plurality of unit pixels (PXs) may be imaging pixels that converts received light incident onto different imaging pixels into electrical charges or signals to represent images carried in the incident light. The imaging pixels can be semiconductor photosensors formed on a substrate such as CMOS sensors. In some embodiments of the disclosed technology, each of the unit pixels (PXs) may convert optical image information into an electrical image signal, and may output the electrical image signal to the correlated double sampler (CDS) 200 through column lines. Each of the unit pixels (PXs) may be coupled to any one of row lines and any one of column lines.

Image sensing devices may use the correlated double sampler (CDS) to remove an offset value of pixels by sampling a pixel signal twice so that the difference is taken between these two samples. For example, the correlated double sampler (CDS) may remove an offset value of pixels by comparing pixel output voltages obtained before and after light is incident on the pixels, so that only pixel signals based on the incident light can be actually measured. The correlated double sampler (CDS) 200 may hold and sample the electrical image signal received from the unit pixels (PXs) of the pixel array 100. For example, the correlated double sampler (CDS) 200 may perform double sampling based on a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

The analog-to-digital converter (ADC) 300 may compare a ramp signal received from the ramp signal generator 800 with a sampling signal received from the correlated double sampler (CDS) 200 to output a comparison signal indicating the result of comparison between the ramp signal and the sampling signal. In some implementations, the ADC 300 may use a reference signal (e.g., ramp signal) to sample an input signal (e.g., pixel signal) multiple times using the reference signal and analog-to-digital convert the sampled input signals by counting the number of clocks until crossing points. The ADC 300 may count a level transition time of the comparison signal in response to a clock signal received from the timing generator 600, and may output a count value indicating the counted level transition time to the buffer 400. For example, the ADC 300 may count clock pulses during a period of time when the input signal is above the reference signal and stop counting clock pulses upon detection of a crossing point (crossing of the reference signal and the input signal).

The buffer 400 may store each of the digital signals received from the analog-to-digital converter (ADC) 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500 may be used to select and drive selected pixels of the pixel array 100 on row line basis in response to an output signal of the timing generator 600. For example, the row driver 500 may generate a selection signal to select any one of the row lines. The selection signal may include a control signal to control on/off operations of pixel transistors(not shown).

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal to control an image signal received from the buffer 400 in response to a control signal received from the timing generator 600.

Figure 2:
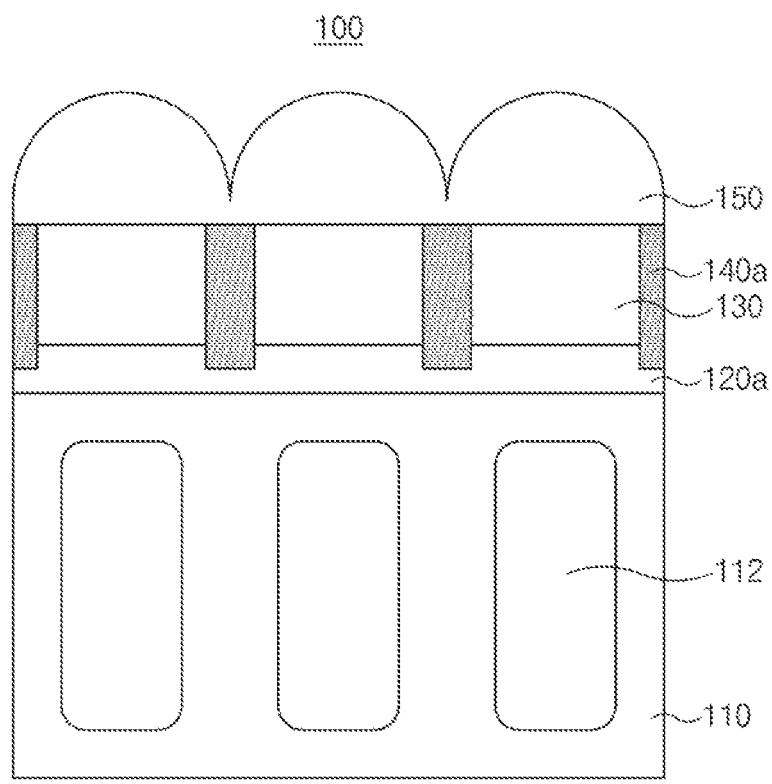
FIG. 2 is a cross-sectional view illustrating a pixel array taken along the line A-A' shown in FIG. 1 based on an embodiment of the disclosed technology.

FIG. 2 is a cross-sectional view illustrating the pixel array 100 taken along the line A-A' shown in FIG. 1 based on an embodiment of the disclosed technology.

Referring to FIG. 2, the pixel array 100 of the image sensing device may include a substrate 110, a buffer layer 120a, a color filter layer 130, one or more grid structures 140a, and a lens layer 150.

The substrate 110 may include a semiconductor substrate made of a suitable semiconductor material. The substrate 110 may be a single-crystal (monocrystalline) semiconductor. For example, the substrate 110 may include a monocrystalline silicon or a monocrystalline silicon-containing material. In some implementations, the substrate 110 may include P-type impurities. Several fabrication processes are performed on the substrate 110 and photoelectric conversion elements 112 are formed on or in the substrate 110.

Each of the photoelectric conversion elements 112 may be implemented to include an organic or inorganic photodiode in some applications and may use other form of photosensing circuitry in other applications. The photoelectric conversion element 112 may include impurity regions vertically stacked on or in the substrate 110. For example, each of the photoelectric conversion elements 112 may include a photodiode in which an N-type impurity region and a P-type impurity region are vertically stacked. The N-type impurity region and the P-type impurity region may be formed by ion implantation.

The buffer layer 120a is substantially transparent to light to be detected and may be structured to operate as a planarization layer to flatten uneven surfaces of predefined structures formed on or in the substrate 110, and may also operate as an anti-reflection film to allow incident light received through the color filter layers 130 to pass through the photoelectric conversion elements 112 while minimizing reflections. The buffer layer 120a may be formed below the grid structures 140a and the color filter layers 130. The buffer layer 120a formed below the grid structures 140a may have different structures compared to the buffer layer 120a formed below the color filter layers 130. The buffer layer 120a may be formed of a multilayer structure formed by stacking different materials having different refractive indices. For example, the buffer layer 120a may include a multilayer structure formed by stacking at least one nitride film and at least one oxide film. The nitride film may include a silicon nitride film (e.g., SixNy, where each of x and y is a natural number) or a silicon oxide nitride film (e.g., SixOyNz, where each of x, y, and z is a natural number). The oxide film may include a monolayer structure formed of any one of an undoped silicate glass (USG) film and an ultra-low temperature oxide (ULTO) film, or may include a multilayer structure formed by stacking the USG film and the ULTO film. A detailed structure of the buffer layer 120 will hereinafter be described in detail.

The color filter layer 130 may include optical filters located above the photoelectric conversion elements 112 to filter the light to be detected by the photoelectric conversion elements 112. For some applications, the color filter layer 130 may be structured to transmit visible light such as a predetermined wavelength range within the visible spectral range while blocking light at other wavelengths from incident light received through the lens layer 150. The color filter layer 130 may include a plurality of color filters, and the color filters may be formed to fill the gaps between the grid structures 140a. In the illustrated example in FIG. 2, a color filter is formed for each unit pixel (PX). The color filter layer 130 may include a plurality of red color filters (Rs), a plurality of green color filters (Gs), and a plurality of blue color filters (Bs). Each red color filter (R) may transmit only red light from among RGB lights of visible light. Each green color filter (G) may transmit only green light from among RGB lights of visible light. Each blue color filter (B) may transmit only blue light from among RGB lights of visible light. The red color filters (Rs), the green color filters (Gs), and the blue color filters (Bs) may be arranged in a Bayer pattern. Alternatively, the color filter layer 130 may include a plurality of cyan color filters, a plurality of yellow color filters, and a plurality of magenta color filters.

The grid structures 140a can be optically opaque or optically absorptive to spatially isolate or separate the space above the substrate 110 into light sensing regions in which the photoelectric conversion elements 112 are located. Each grid structure 140a may be located at a boundary region of adjacent color filters to prevent optical crosstalk from occurring between the adjacent color filters. The grid structures 140a may be formed such that it is in contact with sidewalls of the color filters 130. In some embodiments of the disclosed technology, the grid structure 140a may include an air grid structure including an air layer, a support film, and a capping film. A detailed structure of the grid structures 140a will hereinafter be described in detail.

The lens layer 150 may include a plurality of micro-lenses (and/or a plurality of on-chip lenses) disposed over the color filter layers 130 and the grid structures 140a. The plurality of micro-lenses may converge incident light beams received from the outside and may transmit the light to the color filter layers 130.

Figure 3:
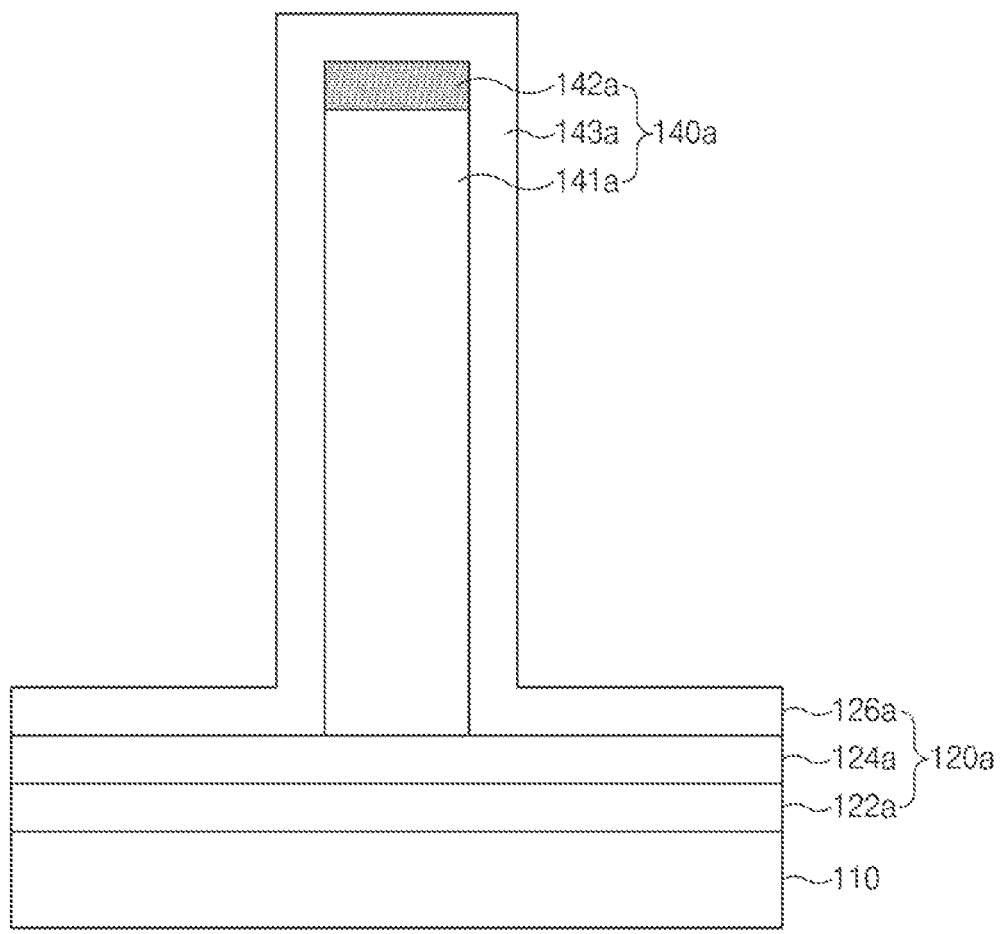
FIG. 3 is a cross-sectional view illustrating a buffer layer and at least one grid structure shown in FIG. 2 based on an embodiment of the disclosed technology.

FIG. 3 is a cross-sectional view illustrating the buffer layer 120a and the grid structure 140a shown in FIG. 2.

Referring to FIG. 3, the grid structure 140a may include an air layer 141a, a support film 142a formed over the air layer 141a, and a capping film 143a formed to cover the air layer 141a and the support film 142a.

The support film 142a may allow the shape of the grid structure 140a to remain unchanged. The support film 142a may prevent the capping film 143a from collapsing in a process for forming the air layer 141a in the grid structure 140a. The support film 142a may include an insulation film with a predetermined light absorption coefficient. The support film 142a may operate as an insulation film that is different in etch selectivity from a spin on carbon (SOC) film. The support film 142a may include at least one of a silicon oxide nitride film (e.g., SixOyNz, where each of x, y, and z is a natural number), a silicon oxide film (e.g., SixOy, where each of x and y is a natural number), and a silicon nitride film (e.g., SixNy, where each of x and y is a natural number). In another embodiment, the support film 142a may include an insulation film having no light absorption characteristics.

The capping film 143a may be a material film formed at an outermost part of the grid structure 140a, and may be formed to cover the entirety of the support film 142a. For example, the capping film 143a may be formed at side surfaces of the support film 142a and at a top surface of the support film 142a. The capping film 143a may be formed of a multilayer structure including an oxide film. For example, the capping film 143a may be formed of a double oxide film. Alternatively, the capping film 143a may be formed of a multilayer structure including different material films, instead of one oxide film and another oxide film surrounding the one oxide film. In this case, the oxide film may include an ultra low temperature oxide (ULTO) film such as a silicon oxide film (SiO2).

The buffer layer 120a may be disposed over the substrate 110, and may include a stacked structure of a nitride film 122a and an oxide film 124a or a stacked structure of a nitride film 122a, an oxide film 124a, and a capping film 126a. For example, in the buffer layer 120a, the stacked structure of the nitride film 122a and the oxide film 124a may be formed below the grid structure 140a, and the stacked structure of the nitride film 122a, the oxide film 124a, and the capping film 126a may be formed between the grid structures 140a.

In this case, the nitride film 122a may include a silicon nitride film (e.g., SixNy, where each of x and y is a natural number) or a silicon oxide nitride film (e.g., SixOyNz, where each of x, y, and z is a natural number). The oxide film 124a may include an undoped silicate glass (USG) film.

In an embodiment of the disclosed technology, the capping film 126a may be formed of the same material film (e.g., oxide film) as the capping film 143a. In another embodiment of the disclosed technology, the capping film 126a and the other capping film 143a are formed in separate deposition processes. In some other embodiments of the disclosed technology, the capping film 126a and the other capping film 143a may also be simultaneously formed by the same deposition process.

FIGS. 4A to 4F are cross-sectional views illustrating methods for forming the structure shown in FIG. 3 according to an embodiment of the disclosed technology.

Figure 4A:
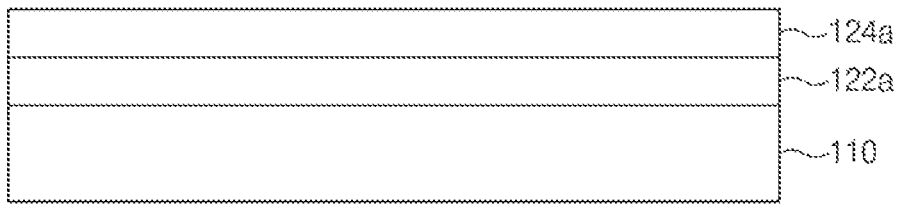
FIGS. 4A to 4F are cross-sectional views illustrating methods for forming the structure shown in FIG. 3 based on an embodiment of the disclosed technology.

Referring to FIG. 4A, the nitride film 122a and the oxide film 124a may be sequentially formed over the substrate 110 including the photoelectric conversion elements 112, such that the nitride film 122a and the oxide film 124a may operate as some parts of the buffer layer 120a.

In this case, the nitride film 122a may include a silicon nitride film (e.g., SixNy, where each of x and y is a natural number) or a silicon oxide nitride film (e.g., SixOyNz, where each of x, y, and z is a natural number). The oxide film 124a may include an undoped silicate glass (USG) film.

Subsequently, the nitride film 122a and the oxide film 124a may be annealed. The annealing process may be carried out in a nitrogen (N2) gas environment.

Figure 4B:
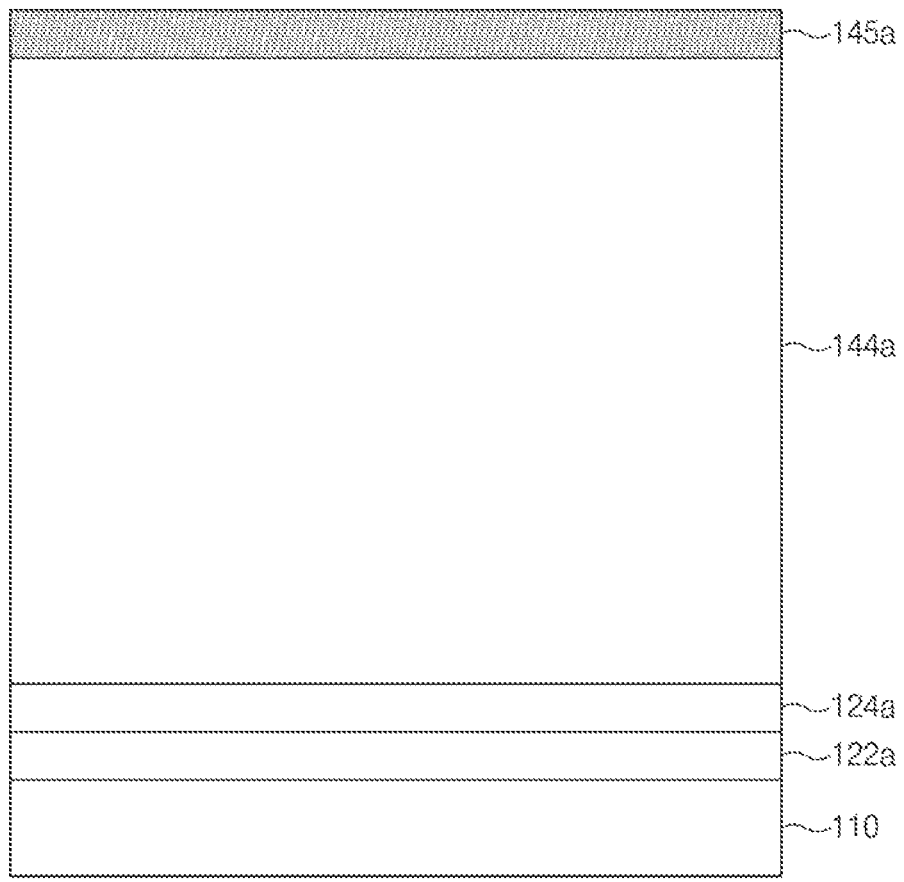

Referring to FIG. 4B, a sacrificial film 144a may be formed over the oxide film 124a, and a support material layer 145a may be formed over the sacrificial film 144a.

The sacrificial film 144a may include a spin on carbon (SOC) film.

The support material layer 145a may be a material layer that is used to prevent the grid structure from collapsing in a subsequent process. The support material layer 145a may be an insulation film that is different in etch selectivity from the sacrificial film 144a, and may include at least one of a silicon oxide nitride film (e.g., SixOyNz, where each of x, y, and z is a natural number), a silicon oxide film (e.g., SixOy, where each of x and y is a natural number), and a silicon nitride film (e.g., SixNy, where each of x and y is a natural number).

Figure 4C:
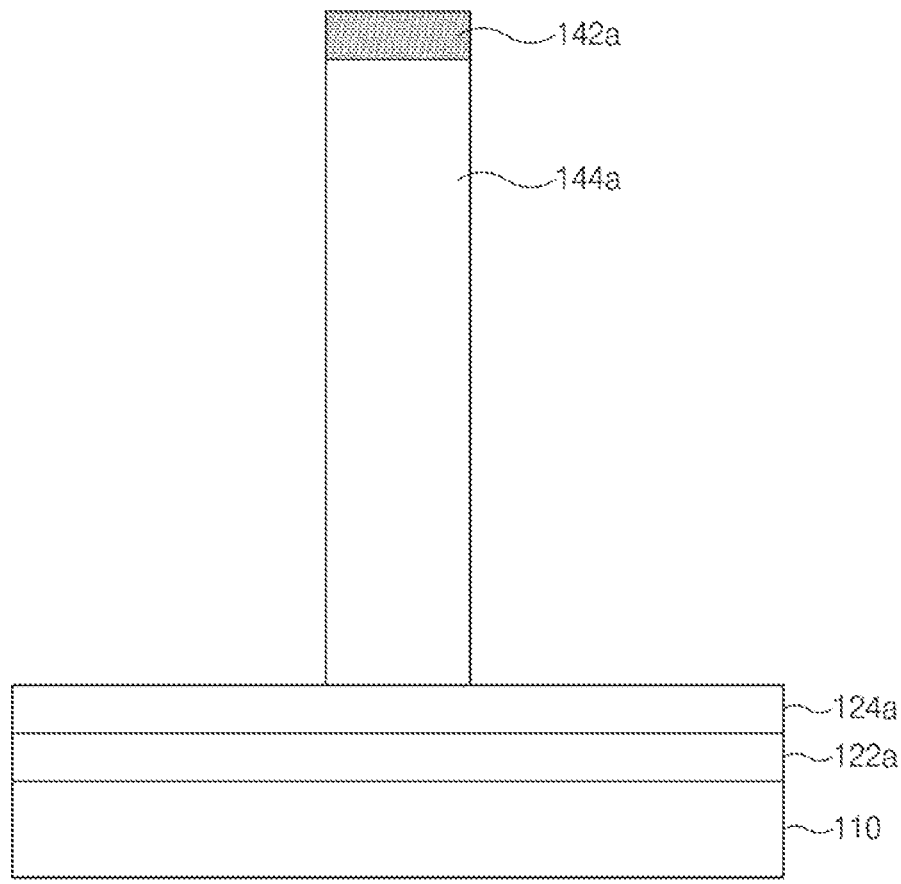

Referring to FIG. 4C, after a mask pattern (not shown) defining a grid structure region is formed over the support material layer 145a, the support material layer 145a may be etched using the mask pattern as an etch mask, forming a support film 142a. In addition, the sacrificial film 144a may be etched using the support film 142a as an etch mask, forming a sacrificial film pattern 144a'.

In this case, the mask pattern formed over the support material layer 145a may include a photoresist pattern.

Figure 4D:
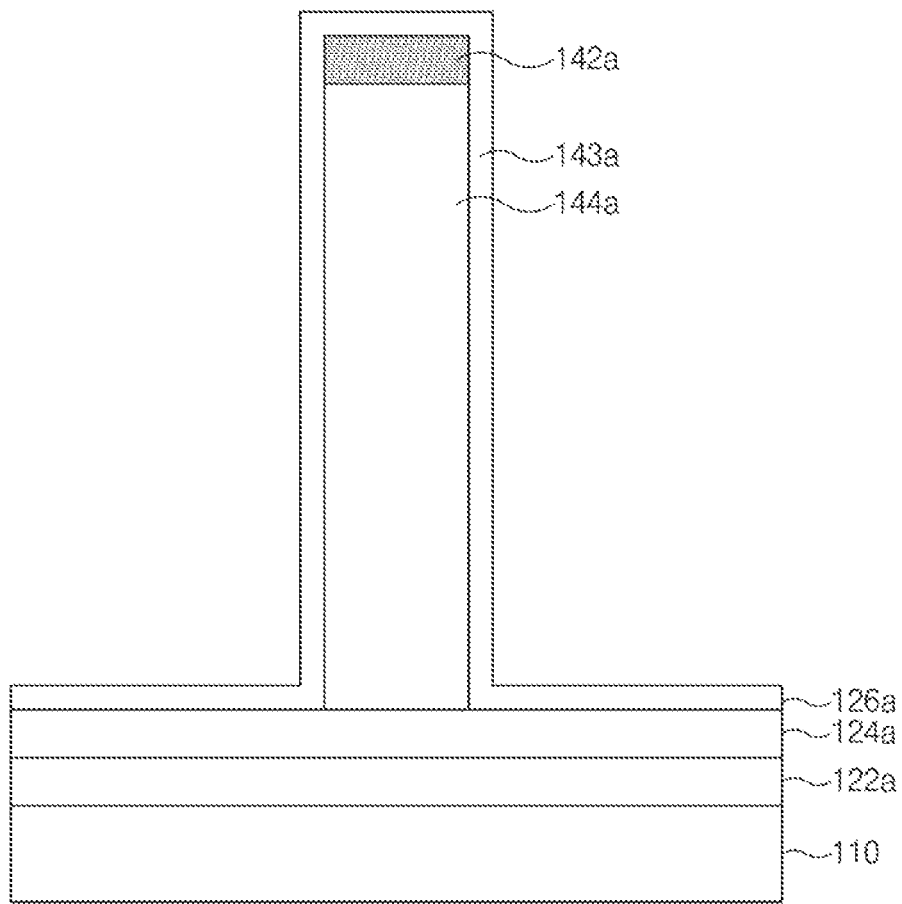

Referring to FIG. 4D, first capping films 143a' and 126a' may be formed over the oxide film 124a, the sacrificial film 144a', and the support film 142a.

Each of the first capping films 143a' and 126a' may include an oxide film such as a ULTO film. Specifically, the first capping film 143a' may be formed to a predetermined thickness. Here, the predetermined thickness may be thin enough for molecules formed by combining gas to be used in a subsequent plasma process with carbon of the sacrificial film 144a' to be easily discharged outside. In some implementations, the first capping film 143a' may be formed to a thickness of 300 Å or less.

In an embodiment of the disclosed technology, the first capping films 143a' and 126a' are distinguished from each other depending on where those films are formed. In another embodiment of the disclosed technology, the first capping films 143a' and 126a' may also be simultaneously formed by the same deposition process.

Figure 4E:
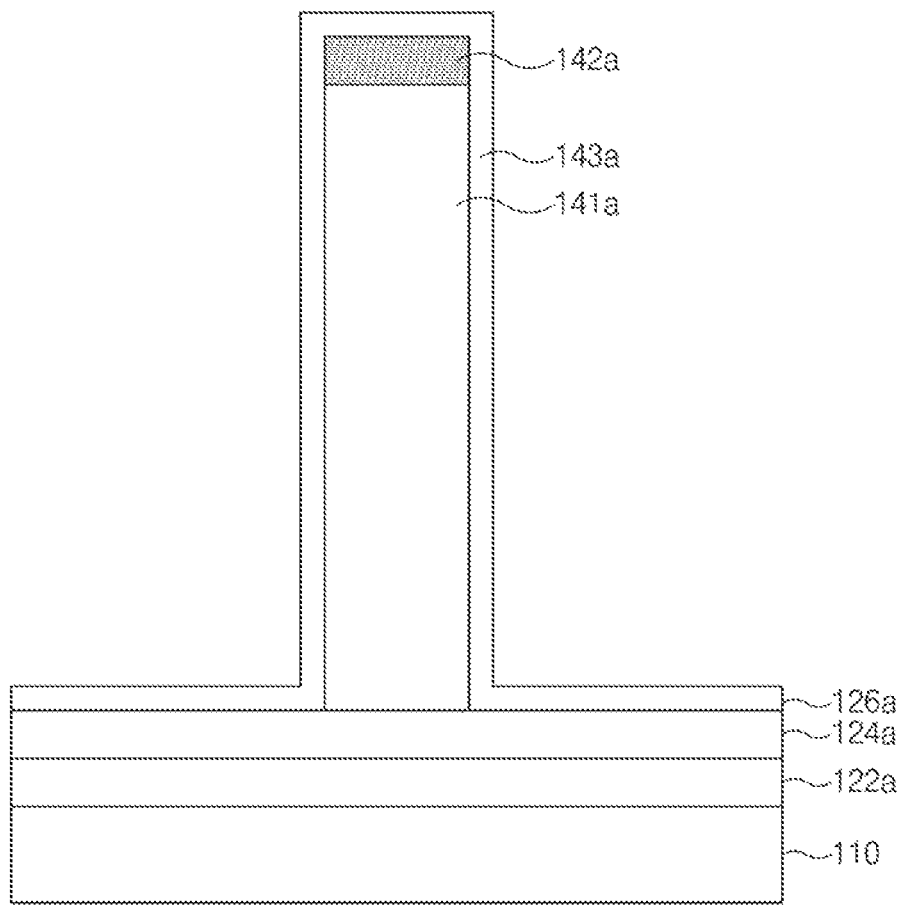

Referring to FIG. 4E, a plasma process may be carried out upon the resultant structure of FIG. 4D to remove the sacrificial film pattern 144a' and form the air layer 141a at the position from which the sacrificial film pattern 144a' is removed. In this case, the plasma process may be designed to use gas including at least one of oxygen, nitrogen, and hydrogen, for example, O2, N2, H2, CO, CO2, CH4, etc.

Figure 5:
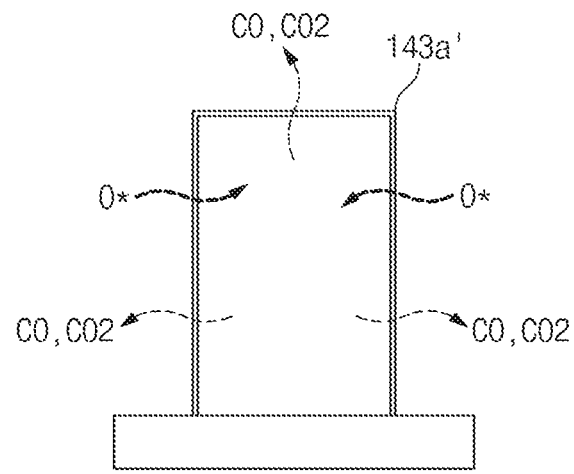
FIG. 5 is a conceptual diagram illustrating a method for removing a sacrificial film pattern using an O2 plasma process.

For example, FIG. 5 is a conceptual diagram illustrating a method for removing the sacrificial film pattern using the 02 plasma process.

Referring to FIG. 5, if the 02 plasma process is carried out upon the resultant structure of FIG. 4D, oxygen radicals (O*) may flow into the sacrificial film pattern 144a' through the first capping film 143a', and the oxygen radicals (O*) included in the sacrificial film pattern 144a' may be combined with carbons of the sacrificial film 144a', forming CO or CO2. The formed CO or CO2 may be discharged outside through the first capping film 143a'. As a result, the sacrificial film pattern 144a' may be removed, and the air layer 141a may be formed at the position from which the sacrificial film pattern 144a' is removed.

In order to prevent collapse of the first capping film 143a' irrespective of etching or non-etching of the sacrificial film pattern 144a', the support film 142a may be formed over the sacrificial film pattern 144a', and the plasma process may then be carried out thereupon.

In order to more easily remove or etch the sacrificial film pattern 144a during the plasma process, the thickness of the first capping film 143a' may be thin enough to be easily removed by a subsequent process. Therefore, under the condition that the support film 142a is not formed over the sacrificial film pattern 144a' and only the sacrificial film pattern 144a' is formed, if the sacrificial film pattern 144a' is removed or etched, the first capping film 143a' may easily collapse. The above-mentioned fact can also be confirmed through experiments.

However, when the support film 142a is first formed over the sacrificial film pattern 144a' and the sacrificial film pattern 144a is then removed or etched, the fact that the first capping film 143a' does not collapse, has been confirmed through experiments. Therefore, in some embodiments of the disclosed technology, after the support film 142a is first formed over the sacrificial film pattern 144a', the sacrificial film pattern 144a' is then removed or etched.

Figure 4F:
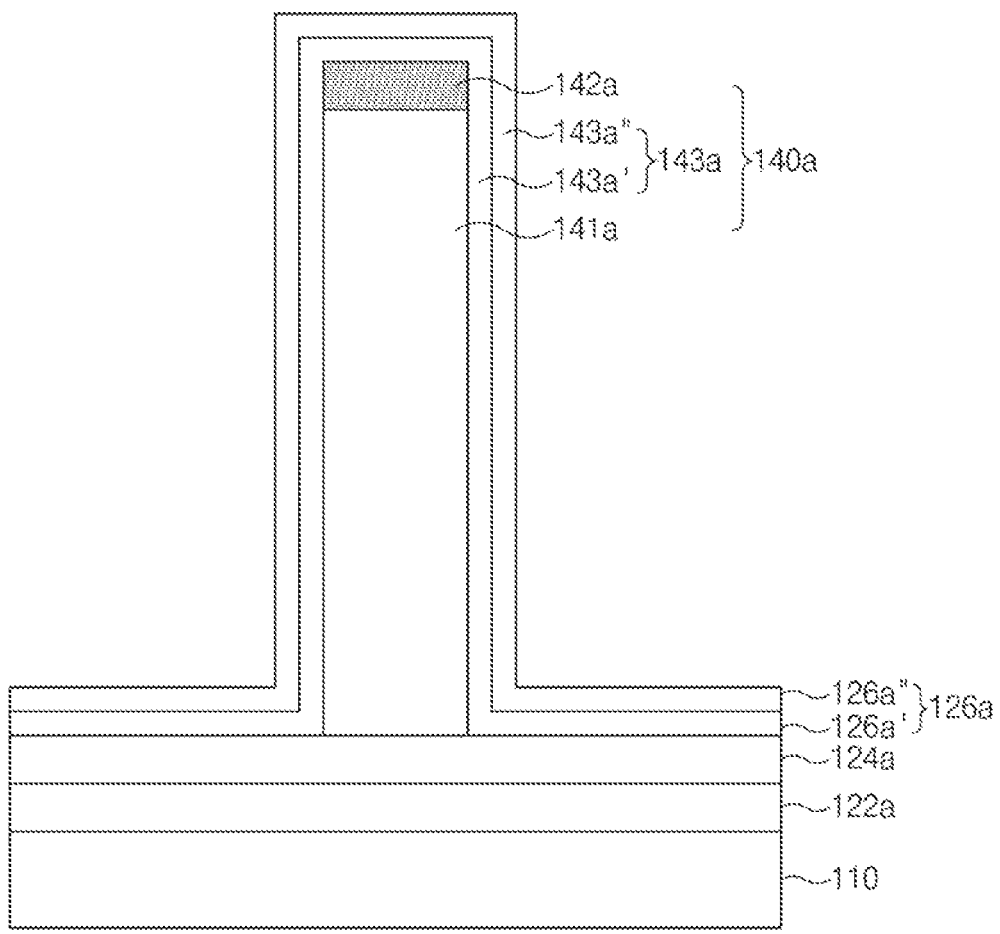

Referring to FIG. 4F, one second capping film 143a" may be formed over the first capping film 143a', and the other second capping film 126a" may be formed over the first capping film 126a'.

If the first capping film 143a' is thick, the above-mentioned plasma process may have difficulty not only in removing the sacrificial film pattern 144a', but also in forming the air layer 141a. Therefore, the first capping film 143a' based on some embodiments of the disclosed technology may be formed thin enough to easily remove the sacrificial film pattern 144a' to facilitate the formation of the air layer 141a, and the second capping film 143a" may be additionally formed over the first capping film 143a' after completion of the plasma process, so that the resulting structure of the above fabrication processes, the grid structure 140a, can be stably maintained. The second capping film 126a" may be additionally formed over the first capping film 126a' disposed between the grid structures 140a, forming the buffer layer 120a.

In an implementation, the second capping film 143a" and the first capping film 143a' may be formed of the same materials, and the second capping film 126a" and the first capping film 126a' may also be formed of the same materials. In another implementation, the second capping film 143a" and the first capping film 143a' may be formed of different materials, and the second capping film 126a" and the first capping film 126a' may also be formed of different materials.

Although the second capping films 143a" and 126a" are illustrated as being separate from each other depending on where those films are formed, the scope of the present disclosure is not limited thereto, and it should be noted that the second capping films 143a" and 126a" may also be simultaneously formed by the same deposition process. In addition, the second capping film 143a" and the first capping film 143a' may be formed under the same fabrication conditions, and the second capping film 126a" and the first capping film 126a' may also be formed under the same fabrication conditions.

Thereafter, the color filter layer 130 may be formed to fill a gap between the grid structures 140a, and the lens layer 150 may be formed over the color filter layer 130.

Figure 6:
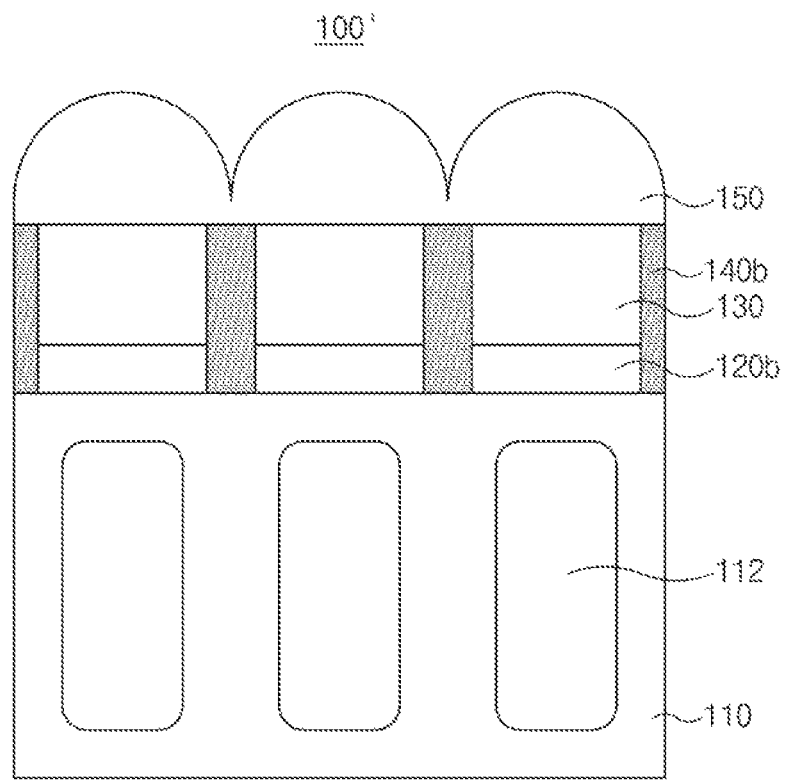
FIG. 6 is a cross-sectional view illustrating a pixel array taken along the line A-A' shown in FIG. 1 based on another embodiment of the disclosed technology.

FIG. 6 is a cross-sectional view illustrating a pixel array 100' taken along the line A-A' shown in FIG. 1 based on another embodiment of the disclosed technology. In FIG. 6, the same reference numerals as those of FIGS. 2 and 3 will be used to refer to the same or like elements for convenience of description.

Referring to FIG. 6, a pixel array 100' of the image sensing device may include a substrate 110, a buffer layer 120b, a color filter layer 130, one or more grid structures 140b, and a lens layer 150.

Compared with the pixel array 100 of FIG. 2, the pixel array 100' shown in FIG. 6 may be different from the pixel array 100 shown in FIG. 2 in terms of the buffer layer 120b and the grid structures 140b, and may be identical to the pixel array 100 shown in FIG. 2 in terms of the substrate 110, the color filter layer 130, and the lens layer 150.

Therefore, a detailed description of the substrate 110, the color filter layer 130, and the lens layer 150 shown in FIG. 6 will herein be omitted for convenience of description.

The buffer layer 120b may be formed below the color filter layer 130 disposed between the grid structures 140b. For example, both the buffer layer 120b and the color filter layer 130 are formed between adjacent grid structures 140b. In some implementations, the buffer layer 120b may include a multilayer structure formed by stacking the oxide film and the nitride film. In this case, the oxide film may include a multilayer structure formed by stacking an undoped silicate glass (USG) film and an ultra low temperature oxide (ULTO) film. The above-mentioned buffer layer 120b will hereinafter be described in detail.

The grid structures 140b may be formed over the substrate 110 while being interposed between the contiguous color filters. Each grid structure 140b may include a metal layer, an air layer, a support film, and a capping film. A detailed structure of the above-mentioned grid structures 140a is as follows.

Figure 7:
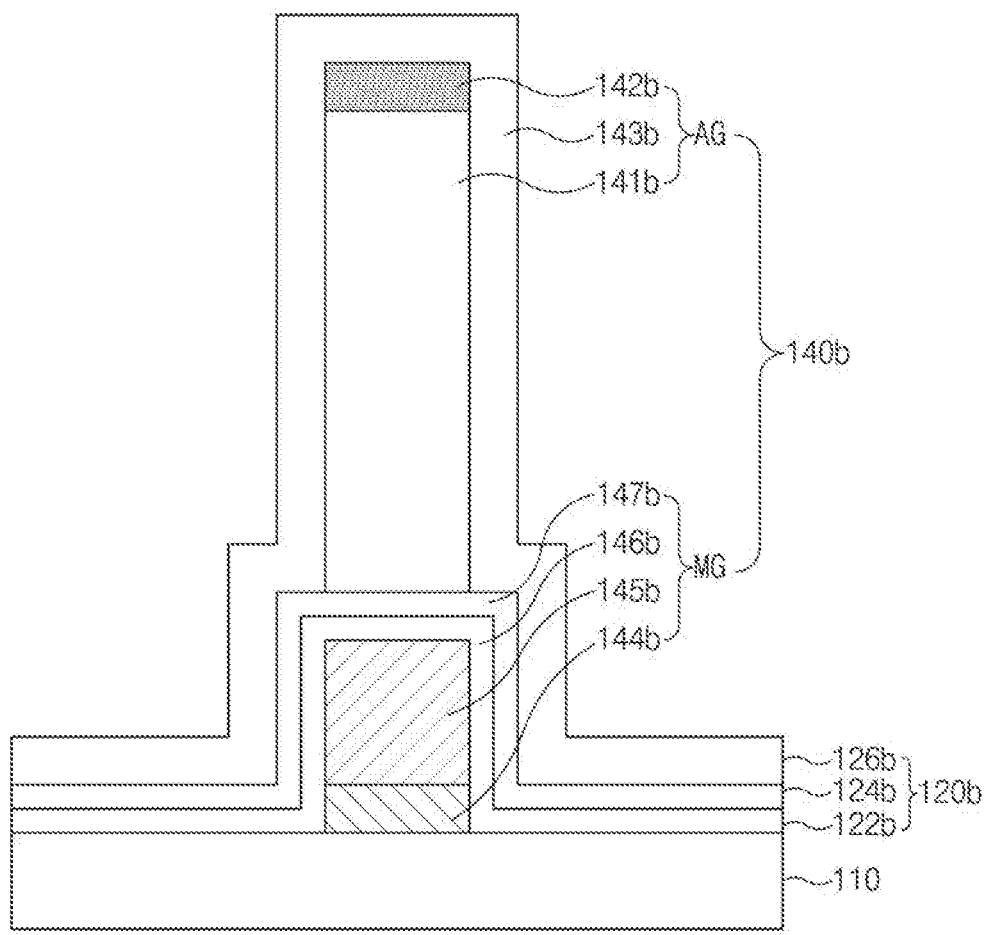
FIG. 7 is a cross-sectional view illustrating a buffer layer and at least one grid structure shown in FIG. 6 based on another embodiment of the disclosed technology.

FIG. 7 is a cross-sectional view illustrating the buffer layer 120b and the grid structures 140b shown in FIG. 6 based on another embodiment of the disclosed technology.

Referring to FIG. 7, each of the grid structures 140b may include a stacked structure of a metal grid structure (MG) and a grid structure (AG).

The metal grid structure (MG) may include a barrier metal layer 144b formed over a substrate 110, a metal layer 145b formed over the barrier metal layer 144b, and insulation films 146b and 147b formed over the barrier metal layer 144b and the metal layer 145b.

The barrier metal layer 144b may include any one of titanium (Ti) and titanium nitride (TiN), or may include a stacked structure of titanium (Ti) and titanium nitride (TiN). The metal layer 145b may include tungsten (W).

The insulation films 146b and 147b may include a nitride film 146b and an oxide film 147b. The nitride film 146b may include a silicon nitride film (e.g., SixNy, where each of x and y is a natural number) or a silicon oxide nitride film (e.g., SixOyNz, where each of x, y, and z is a natural number). The oxide film 147b may include an undoped silicate glass (USG) film. The nitride film 146b and the oxide film 147b may be formed not only at side surfaces of the barrier metal layer 144b and the metal layer 145b, but also at a top surface of the metal layer 145b.

Each of the insulation films 146b and 147b may also be formed of an oxide material such as SiO2 with or without others.

The air grid structure (AG) may include an air layer 141b formed over the metal grid structure (MG), a support film 142b formed over the air layer 141b, and a capping film 143b formed to cover the entirety of the air layer 141b and the support film 142b. For example, the capping film 143b may be formed not only at side surfaces of the air layer 141b and the support film 142b, but also at a top surface of the support film 142b. In addition, the capping film 143b may be formed to extend to the side surfaces of the metal grid structure (MG).

The support film 142b may include an insulation film with a predetermined light absorption coefficient. The support film 142b may operate as an insulation film that is different in etch selectivity from a Spin On Carbon (SOC) film. The support film 142b may include at least one of a silicon oxide nitride film (e.g., SixOyNz, where each of x, y, and z is a natural number), a silicon oxide film (e.g., SixOy, where each of x and y is a natural number), and a silicon nitride film (SixNy, where each of x and y is a natural number). In another embodiment, the support film 142b may include an insulation film having no light absorption characteristics.

The capping film 143b may be formed of a multilayer structure including an oxide film. For example, the capping film 143b may be formed of two or more oxide films. Alternatively, the capping film 143b may be formed of a multilayer structure including different material films, instead of one oxide film and another oxide film surrounding the one oxide film. In this case, the oxide film may include an ultra low temperature oxide (ULTO) film such as a silicon oxide film (SiO2).

The buffer layer 120b may be disposed over the substrate 110 interposed between the grid structures 140b, and may be formed of a stacked structure of the nitride film 122b, the oxide film 124b, and the capping film 126b.

In this case, the oxide film 124b may include an USG film, and the capping film 126b may include the same material film as the capping film 143b.

Although FIG. 7 illustrates the oxide film 124b as being separated from the oxide film 147b, the scope of the present disclosure is not limited thereto, and it should be noted that the oxide film 124b and the oxide film 147b may also be simultaneously formed by the same deposition process.

Likewise, although FIG. 7 illustrates the capping film 126b as being separate from the other capping film 143b, the scope of the present disclosure is not limited thereto, and it should be noted that the capping film 126b and the other capping film 143b may also be simultaneously formed by the same deposition process as necessary.

FIGS. 8A to 8F are cross-sectional views illustrating methods for forming the structure shown in FIG. 7 based on another embodiment of the disclosed technology.

Figure 8A:
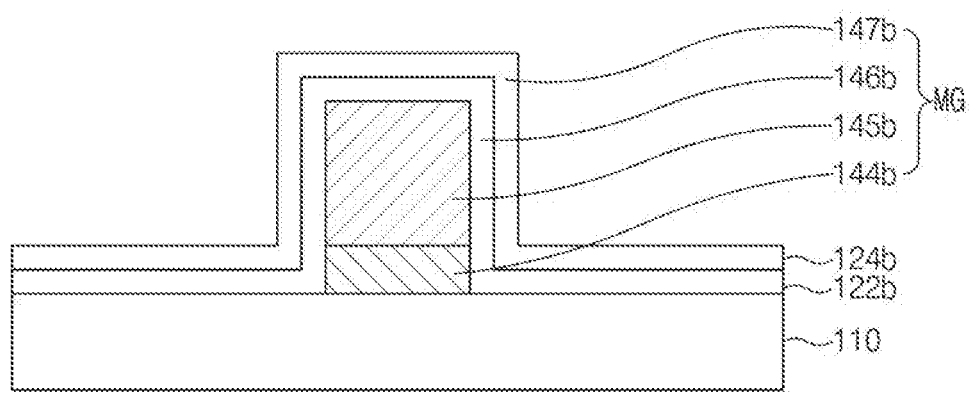
FIGS. 8A to 8F are cross-sectional views illustrating methods for forming the structure shown in FIG. 7 based on another embodiment of the disclosed technology.

Referring to FIG. 8A, the barrier metal layer 144b and the metal layer 145b may be sequentially formed over the substrate 110 including one or more photoelectric conversion elements 112.

For example, after the barrier metal layer and the metal layer have been sequentially deposited over the substrate 110, the barrier metal layer and the metal layer may be etched using a mask pattern (not shown) formed to define the grid structure region as an etch mask, forming the barrier metal layer 144b and the metal layer 145b. The barrier metal layer 144b may include any one of titanium (Ti) and titanium nitride (TiN), or may include a stacked structure of titanium (Ti) and titanium nitride (TiN). The metal layer 145b may include tungsten (W).

Subsequently, the nitride films 122b and 146b may be formed over the substrate 110, the barrier metal layer 144b, and the metal layer 145b, and the oxide films 124b and 145b may be formed over the nitride films 122b and 146b, forming the grid structure MG in the grid structure region.

Although FIG. 8A illustrates the nitride film 122b as being separate from the nitride film 146b depending on where those nitride films are formed, the scope of the present disclosure is not limited thereto, and it should be noted that the nitride films 122b and 146b may also be simultaneously formed by the same deposition process as necessary. That is, the nitride film 146b and the oxide film 147b may operate as some parts of the metal grid structure (MG), and may be formed over the barrier metal layer 144b and the metal layer 145b. The nitride film 122b and the oxide film 124b may operate as some parts of the buffer layer 120b, and may be formed between the metal grid structures (MG).

Each of the nitride films 122b and 146b may include a silicon nitride film (e.g., SixNy, where each of x and y is a natural number) or a silicon oxide nitride film (e.g., SixOyNz, where each of x, y, and z is a natural number). Each of the oxide films 124b and 147b may include an undoped silicate glass (USG) film.

Subsequently, the nitride films 122b and the oxide film 146b may be annealed. The annealing process may be carried out in a nitrogen (N2) gas environment.

Figure 8B:
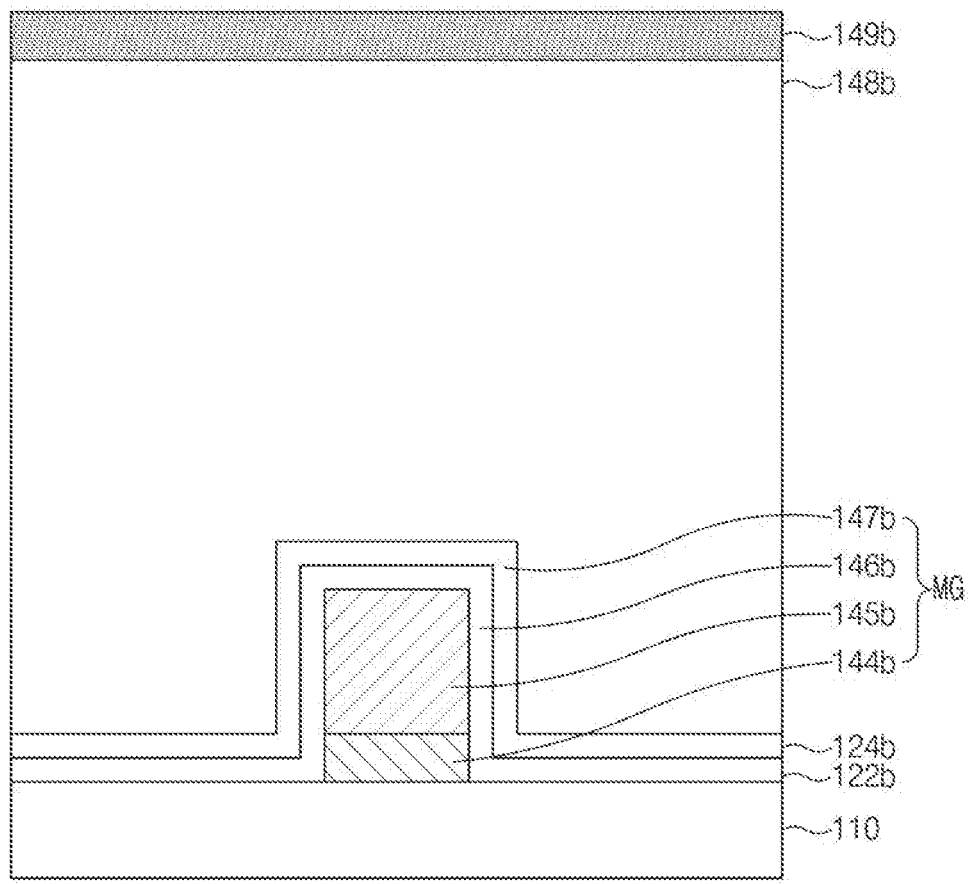

Referring to FIG. 8B, a sacrificial film 148b may be formed over the oxide films 124b and 147b, and a support material layer 149b may be formed over the sacrificial film 148b.

In this case, the sacrificial film 148b may include a spin on carbon (SOC) film.

The support material layer 149b may be a material layer to prevent the grid structure from collapsing in a subsequent process. The support material layer 149b may be an insulation film that is different in etch selectivity from the sacrificial film 148b, and may include at least one of a silicon oxide nitride film (e.g., SixOyNz, where each of x, y, and z is a natural number), a silicon oxide film (e.g., SixOy, where each of x and y is a natural number), and a silicon nitride film (e.g., SixNy, where each of x and y is a natural number).

Figure 8C:
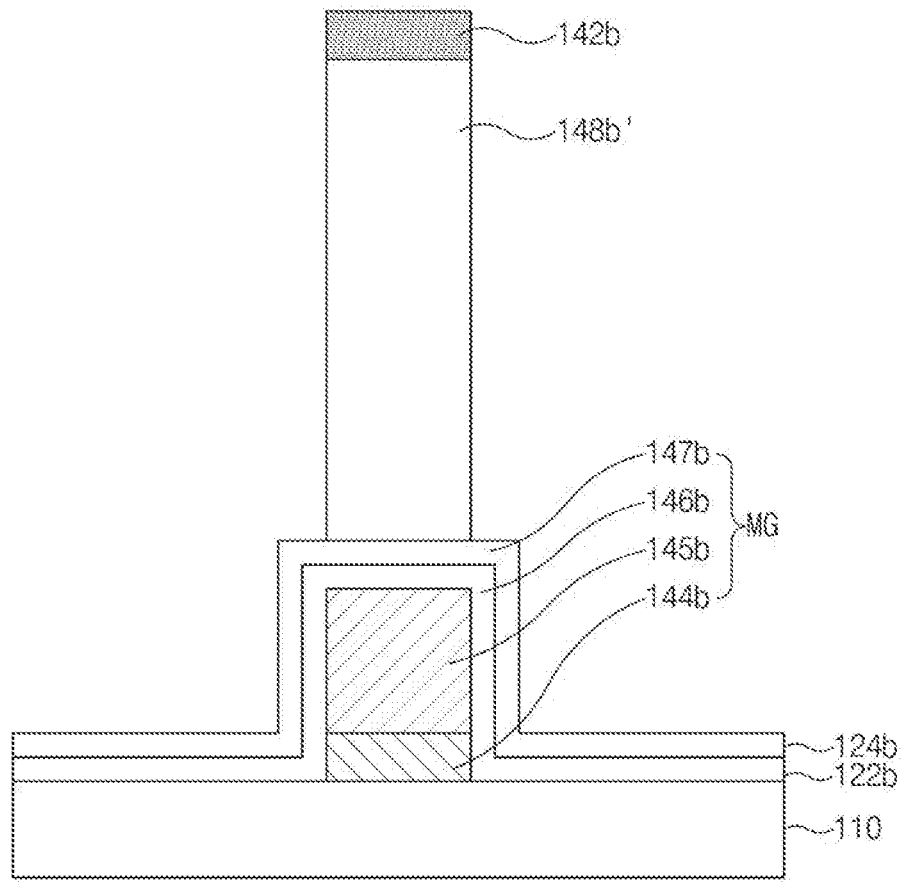

Referring to FIG. 8C, after a mask pattern (not shown) defining the grid structure region is formed over the support material layer 149b, the support material layer 149b may be etched using the mask pattern as an etch mask, forming a support film 142b. In addition, the sacrificial film 148b may be etched using the support film 142b as an etch mask, forming a sacrificial film pattern 148b'.

In this case, the mask pattern formed over the support material layer 149b may include a photoresist pattern.

Figure 8D:
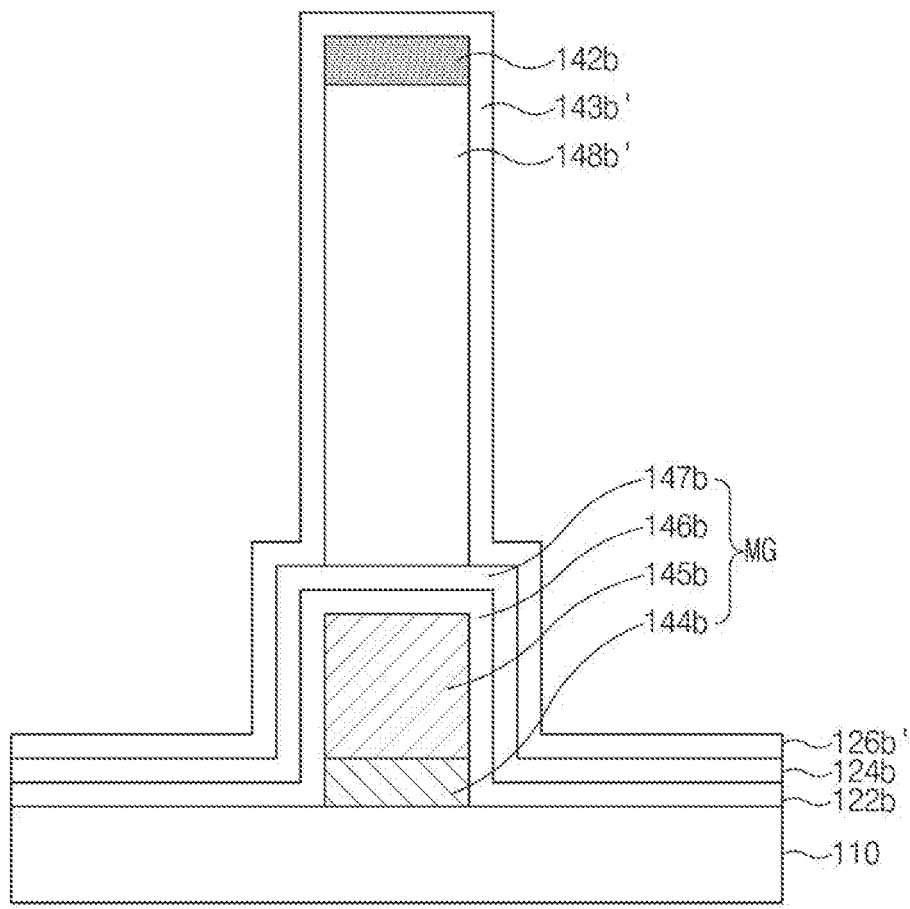

Referring to FIG. 8D, first capping films 143b' and 126b' may be formed over the oxide film 124b, the sacrificial film 148b', and the support film 142b.

Each of the first capping films 143b' and 126b' may include an oxide film such as a ULTO film. Specifically, the first capping film 143b' may be formed to a predetermined thickness through which molecules formed by combining gas to be used in a subsequent plasma process with carbon of the sacrificial film 148b' can be easily discharged outside. Preferably, the first capping film 143b' may be formed to a thickness of 300 Å or less.

Although FIG. 8D illustrates the first capping films 143b' as being separate from 126b' depending on where such films are formed for convenience of description, the scope of the present disclosure is not limited thereto, and it should be noted that the first capping films 143b' and 126b' may also be simultaneously formed by the same deposition process.

Figure 8E:
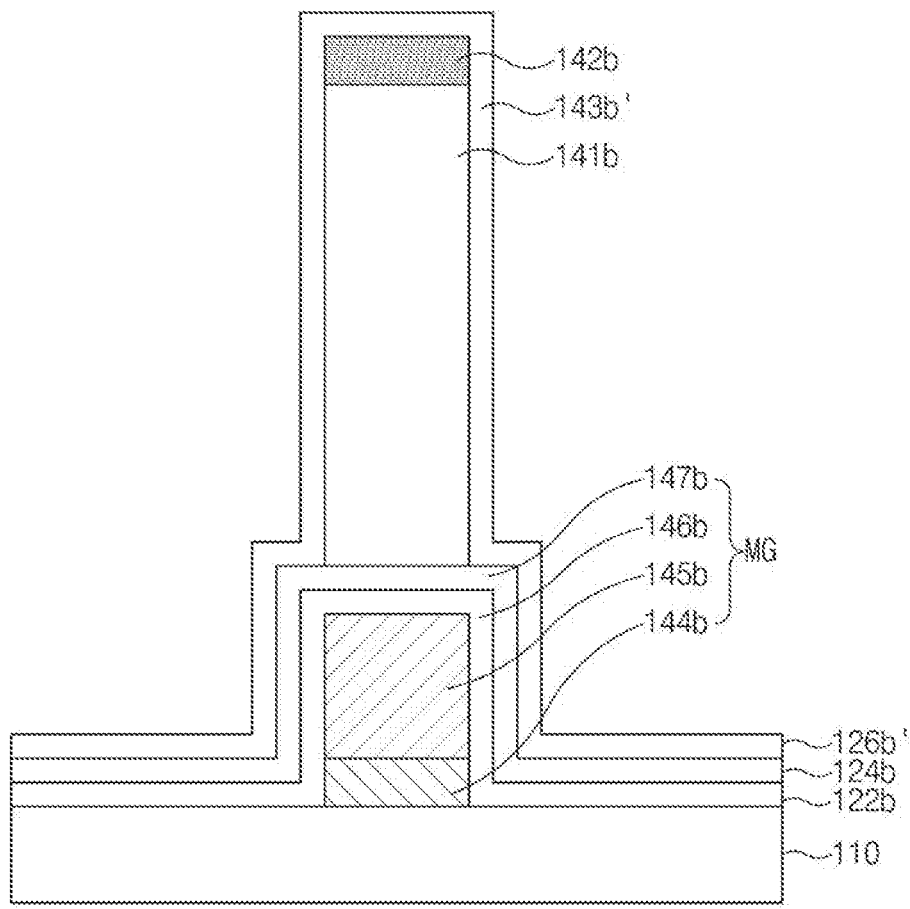

Referring to FIG. 8E, a plasma process may be carried out upon the resultant structure of FIG. 8D to remove the sacrificial film pattern 148b' and form the air layer 141a at the position from which the sacrificial film pattern 148b' is removed.

The plasma process to remove the sacrificial film pattern 148b' and form the air layer 141b shown in FIG. 8E may be identical to the plasma process shown in FIG. 4E.

Figure 8F:
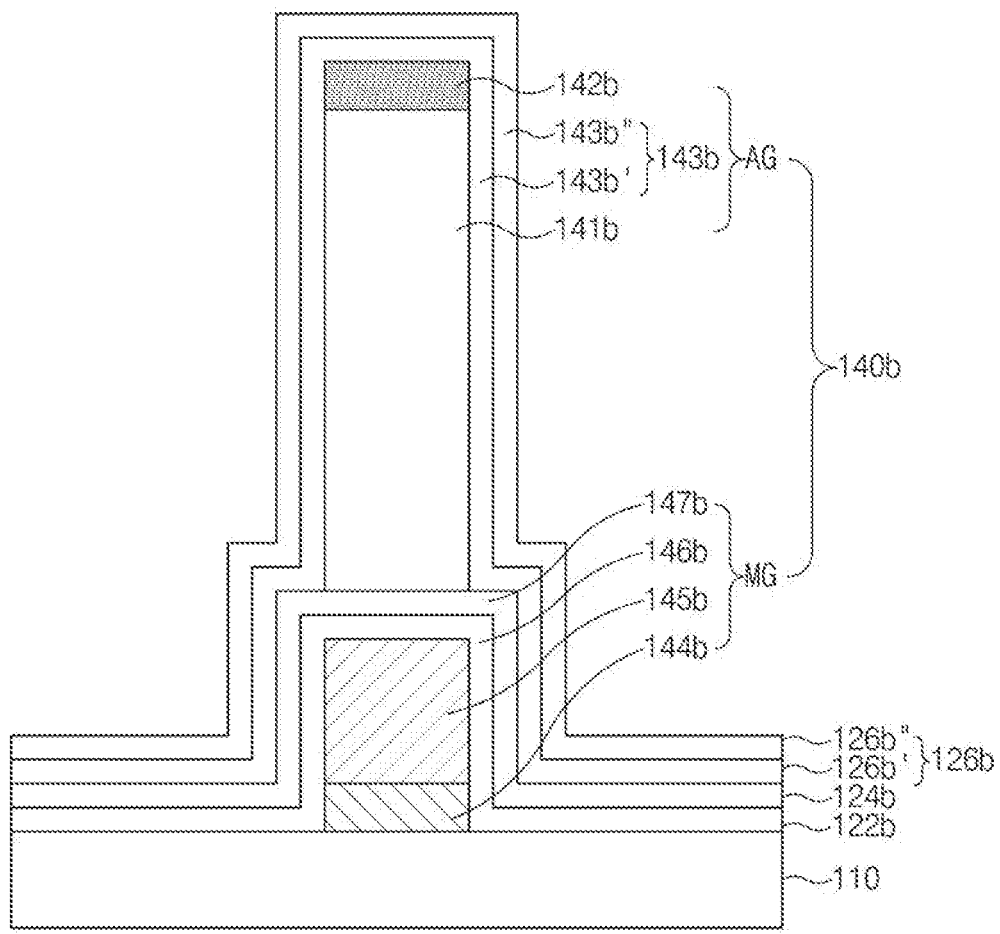

Referring to FIG. 8F, the second capping film 143b" may be formed over the first capping film 143b', and the second capping film 126b" may be formed over the first capping film 126b' to form the air grid structure (AG) over the metal grid structure (MG).

If the first capping film 143b' is thick, the above-mentioned plasma process may have difficulty not only in removing the sacrificial film pattern 148b', but also in forming the air layer 141b. Therefore, the capping film 143b may be formed as follows based on some embodiments of the disclosed technology. First, the first capping film 143b' is formed. The first capping film 143b' should be thin enough to facilitate the subsequent plasma process. Subsequently, the second capping film 143b" may be additionally formed over the first capping film 143b' after completion of the plasma process. The second capping film 143b" may be thick enough to help maintain the shape of the air grid structure (AG). In this way, the capping film 143b may have a predefined thickness so that the shape of the air grid structure (AG) can be stably maintained. In some implementations, the second capping film 126b" may be additionally formed over the first capping film 126b'. As a result, the buffer layer 120b may include the first capping film 126b' and the second capping film 126b".

In an implementation, the second capping film 143b" and the first capping film 143b' may be formed of the same materials, and the second capping film 126b" and the first capping film 126b' may also be formed of the same materials. In another implementation, the second capping film 143b" and the first capping film 143b' may be formed of different materials, and the second capping film 126b" and the first capping film 126b' may also be formed of different materials.

Although the second capping films 143b" and 126b" are illustrated as being separate from each other depending on where those films are formed, the scope of the present disclosure is not limited thereto, and it should be noted that the second capping films 143b" and 126b" may also be simultaneously formed by the same deposition process. In addition, the second capping film 143b" and the first capping film 143b' may be formed under the same fabrication conditions, and the second capping film 126b" and the first capping film 126b' may also be formed under the same fabrication conditions.

Thereafter, the color filter layer 130 may be formed to fill a gap between the grid structures 140b, and the lens layer 150 may be formed over the color filter layer 130.

Figure 9:
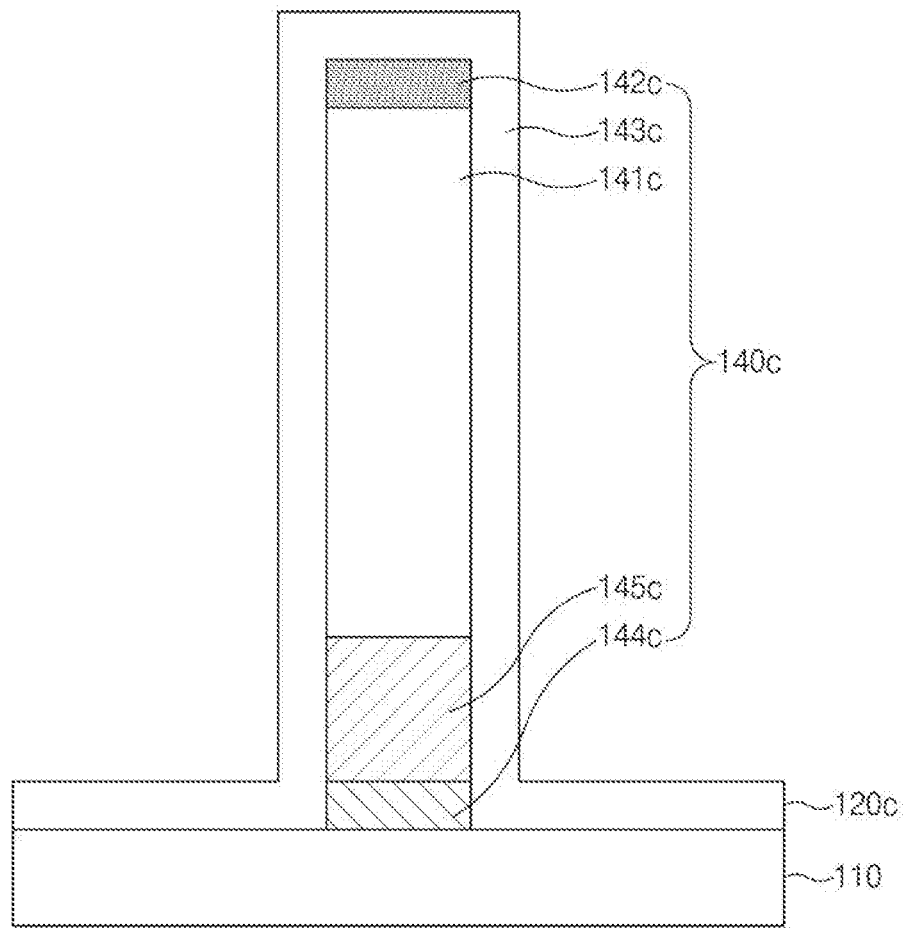
FIG. 9 is a cross-sectional view illustrating a buffer layer and a grid structure based on another embodiment of the disclosed technology.

FIG. 9 is a cross-sectional view illustrating a buffer layer and a grid structure 140c based on another embodiment of the disclosed technology.

Referring to FIG. 9, the grid structure 140c may include a barrier metal layer 144c formed over the substrate 110, a metal layer 145c formed over the barrier metal layer 144c, an air layer 141c formed over the metal layer 145c, a support film 142c formed over the air layer 141c, and a capping film 143c formed to cover the entirety of the support film 142c, the air layer 141c, the metal layer 145c, and the barrier metal layer 144c.

Unlike the grid structure 140b shown in FIG. 7, the grid structure 140c shown in FIG. 9 may not include a nitride film and an oxide film that are formed to cover the barrier metal layer 144c and the metal layer 145c. In other words, it should be noted that the nitride film 146b and the oxide film 147b shown in FIG. 7 may not be formed over the barrier metal layer 144c and the metal layer 145c.

The support film 142c shown in FIG. 9 may be identical in structure to the support film 142a or 142b shown in FIG. 3 or FIG. 7. The capping film 143c shown in FIG. 9 may be identical in structure to the support film 143a or 143b shown in FIG. 3 or FIG. 7.

The buffer layer 120c may be formed over the substrate 110, and may be identical in structure to the capping film 143c. The buffer layer 120c and the capping film 143c may also be simultaneously formed by the same deposition process.

In yet another embodiment of the disclosed technology, an insulation film such as SiO2 may also be formed over the metal layer 145c shown in FIG. 9. That is, an insulation film such as SiO2 may also be formed between the metal layer 145c and the air layer 141c.

As is apparent from the above description, the image sensing device based on some embodiments of the disclosed technology may include an air grid structure to effectively prevent optical crosstalk between the color filters while minimizing loss of light.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Only a few implementations and examples are described for the disclosed technology. Other implementations, enhancements and variations can be made based on what is described and illustrated in this patent document.

What is claimed is:

1. An image sensing device comprising:
a substrate including an array of photoelectric conversion elements; and
a grid structure disposed over the substrate to divide space above the substrate into different sensing regions with each sensing region including one or more photoelectric conversion elements,
wherein the grid structure includes:
an air layer;
a support film formed over the air layer; and
a capping film formed at side surfaces of the air layer and the support film and at a top surface of the support film.

2. The image sensing device according to claim 1, wherein the support film includes at least one of a $Si_xO_yN_z$ film, where each of x, y, and z is a natural number, and a $Si_mN_n$ film, where each of m and n is a natural number.

3. The image sensing device according to claim 2, wherein the capping film includes:
a first capping film formed at side surfaces of the air layer and the support film and at a top surface of the support film; and
a second capping film formed over the first capping film.

4. The image sensing device according to claim 3, wherein the first capping film includes an ultra low temperature oxide (ULTO) film.

5. The image sensing device according to claim 1, wherein the grid structure further includes:
a metal grid structure formed below the air layer.

6. The image sensing device according to claim 5, wherein the metal grid structure includes:
a barrier metal layer; and
a metal layer formed over the barrier metal layer.

7. The image sensing device according to claim 6, wherein the grid structure further includes:
an insulation film formed between the metal layer and the air layer.

8. The image sensing device according to claim 7, wherein the insulation film is formed to extend to side surfaces of the metal layer and the barrier metal layer.

9. The image sensing device according to claim 8, wherein the capping film is formed to extend to side surfaces of the metal grid structure.

10. A method for forming an image sensing device comprising:
forming a sacrificial film over a substrate including one or more photoelectric conversion elements;
forming a support material layer over the sacrificial film;
patterning the sacrificial film and the support material layer, and forming a stacked structure of a sacrificial film pattern and a support film in a predefined grid structure region;
forming a first capping film to cover the stacked structure of the sacrificial film pattern and the support film;
removing the sacrificial film pattern, and forming an air layer at a position from which the sacrificial film pattern is removed; and
forming a second capping film over the first capping film.

11. The method according to claim 10, wherein the forming the sacrificial film includes:
forming a carbon-containing material film over the substrate.

12. The method according to claim 11, wherein the carbon-containing material film includes a spin on carbon (SOC) material.

13. The method according to claim 11, wherein the forming the support film includes:
forming at least one of a $Si_xO_yN_z$ film, where each of x, y, and z is a natural number, and a $Si_mN_n$ film, where each of m and n is a natural number.

14. The method according to claim 13, wherein the forming the first capping film includes:
forming an oxide film at side surfaces of the sacrificial film pattern and the support film and at a top surface of the support film.

15. The method according to claim 14, wherein the forming the air layer includes:
performing a plasma process upon the sacrificial film pattern in a manner that carbon contained in the sacrificial film pattern is combined with gas used in the plasma process.

16. The method according to claim 10, wherein the forming the second capping film includes:
forming a material film substantially identical to the first capping film over the first capping film.

17. The method according to claim 10, further comprising:
prior to forming the sacrificial film, forming a metal grid structure in the grid structure region.

18. The method according to claim 17, wherein the forming the metal grid structure includes:
forming a barrier metal layer over the substrate of the grid structure region; and
forming a metal layer over the barrier metal layer.

19. The method according to claim 18, wherein the forming the metal grid structure further includes:
forming an insulation film at side surfaces of the barrier metal layer and the metal layer and at a top surface of the metal layer.

20. The method according to claim 17, wherein the forming the first capping film includes:
forming an oxide film at side surfaces of the metal grid structure, the sacrificial film pattern, and the support film, and at a top surface of the support film.

* * * * *